US006088373A

United States Patent [19]
Hakki

[11] Patent Number: 6,088,373
[45] Date of Patent: Jul. 11, 2000

[54] HYBRID TUNABLE BRAGG LASER

[75] Inventor: Basil Wahid Hakki, Allentown, Pa.

[73] Assignee: Lucent Technologies Inc., Murray Hill, N.J.

[21] Appl. No.: 09/251,629

[22] Filed: Feb. 17, 1999

[51] Int. Cl.[7] .................. H01S 3/10; H01S 3/30; H01S 3/13; H01S 3/08; G02B 6/26
[52] U.S. Cl. .................. 372/20; 372/99; 372/19; 372/33; 372/9; 372/92; 372/32; 372/102; 372/6; 372/45; 372/96; 385/40
[58] Field of Search ................. 372/20, 99, 19, 372/33, 45, 96, 9, 92, 32, 102, 6; 385/40

[56] References Cited

U.S. PATENT DOCUMENTS

| | | | |
|---|---|---|---|
| 4,920,542 | 4/1990 | Brosson et al. | 372/50 |
| 5,253,314 | 10/1993 | Alferness et al. | 385/40 |
| 5,337,328 | 8/1994 | Lang et al. | 372/45 |
| 5,870,417 | 2/1999 | Verdiell et al. | 372/32 |
| 5,914,972 | 6/1999 | Siala et al. | 372/33 |
| 5,920,588 | 7/1999 | Watanabe | 372/96 |

*Primary Examiner*—Robert H. Kim
*Assistant Examiner*—Delma R. Flores Ruiz
*Attorney, Agent, or Firm*—Darby & Darby

[57] ABSTRACT

A hybrid tunable Bragg laser including a double heterostructure gain section, a Bragg reflector section optically coupled to said gain section, and an optical extension constructed to yield a plurality of longitudinal modes. Preferably, the optical section has a predetermined length and effective reflectivity adapted to yield the plurality of longitudinal modes.

14 Claims, 3 Drawing Sheets

HYBRID TUNABLE BRAGG LASER

FIELD OF THE INVENTION

The present invention relates generally to wavelength tuning of laser devices and, more particularly, to a hybrid tunable Bragg laser device.

BACKGROUND OF THE INVENTION

Tunable laser devices are known in the art. For example, there are electromechanically tuned lasers, for example the HP8168 tunable laser, available from Hewlett-Packard, Inc., Palo Alto, Calif. the United States. Such laser devices include a gain section and a mechanically adjustable, external, reflective grating. Wavelength tuning is performed by mechanically adjusting the angle of the external grating until the desired wavelength is reached.

Electrically tunable distributed Bragg lasers are also known in the art. Such laser devices may include a gain section, a phase section and a Bragg reflector section. The phase section is typically integrally formed with the gain and Bragg reflector sections, on a single laser chip, and the length of the phase section is not greater than 200 micrometers. At this length, the laser has a single longitudinal mode. Tuning of the laser is performed by adjusting the bias voltages of the phase and/or gain and/or Bragg reflector sections. Although electrical tuning is generally convenient, such laser devices have a number of drawbacks. A primary disadvantage is that tuning of such devices is not continuous, due to mode hopping, and there are substantial gaps in the tuning range. Additionally, such devices have a limited wavelength tuning range. Experiments with electrically tunable Bragg laser are described, inter alia, in the following publications:

- F. Delorme and G. Alibert, "Reliability study of 1.55 micron DBR lasers grown in three MOVPE steps", Optical Fiber Conference, 1997, Dallas, Tex., paper FC2;
- F. Delorme, S. Slemkes, G. Alibert, B. Rose and J. Brandon, "Butt-jointed DBR laser with 15 nm tunability grown in three MOVPE steps", Electronic Letters vol. 31, pp. 1244–1245, July, 1995;
- T. L. Koch, U. Koren and B. I. Miller, "High performance tunable 1.5 micron InGaAs/InGaAsP multiple quantum well distributed Bragg reflector Lasers", Appl. Phys. Lett. vol. 53, pp. 1036–1038, September 1998; and
- S. Murata, I. Mito and K. Kobayashi, "Over 720 Ghz (5.8 nm) frequency tuning by a 1.5 micron DBR laser with phase and Bragg wavelength control regions", Electronic Letter vol. 23, pp. 403–404, April 1987.

SUMMARY OF THE INVENTION

It is an object of the present invention to provide a hybrid tunable Bragg laser device featuring continuous wavelength tuning over a predetermined wavelength range, for example, a wavelength range on the order of 20 nm range, such as 1540–1560 nm. A hybrid tunable Bragg laser in accordance with the invention may be used, for example, in dense wavelength division multiplexing applications where remotely controllable wavelength tuning is required.

A laser device in accordance with an embodiment of the present invention includes three sections, namely, a double heterostructure gain section, a Bragg reflector section optically coupled to the gain section, and an optical extension having a predetermined length, $L_e$, and a predetermined effective reflectivity, $R_e$. The extended optical section provides a plurality of longitudinal modes.

In a preferred embodiment of the present invention, the hybrid tunable Bragg laser is operated by biasing the double heterostructure gain section to a level which provides unity round trip gain in the optical path of the laser. Tuning of the hybrid tunable Bragg laser may then be performed by biasing the Bragg reflector section to alter its refractive index and, thus, to alter the laser output wavelength. By providing a sufficient number of longitudinal modes in the extended optical section, the present invention enables substantially continuous wavelength tuning of the hybrid tunable Bragg laser, without mode hopping.

BRIEF DESCRIPTION OF THE DRAWINGS

The present invention will be understood and appreciated more fully from the following detailed description of a preferred embodiment of the invention, taken in conjunction with the following drawings of which.

DETAILED DESCRIPTION OF A PREFERRED EMBODIMENT OF THE INVENTION

Figure 1:
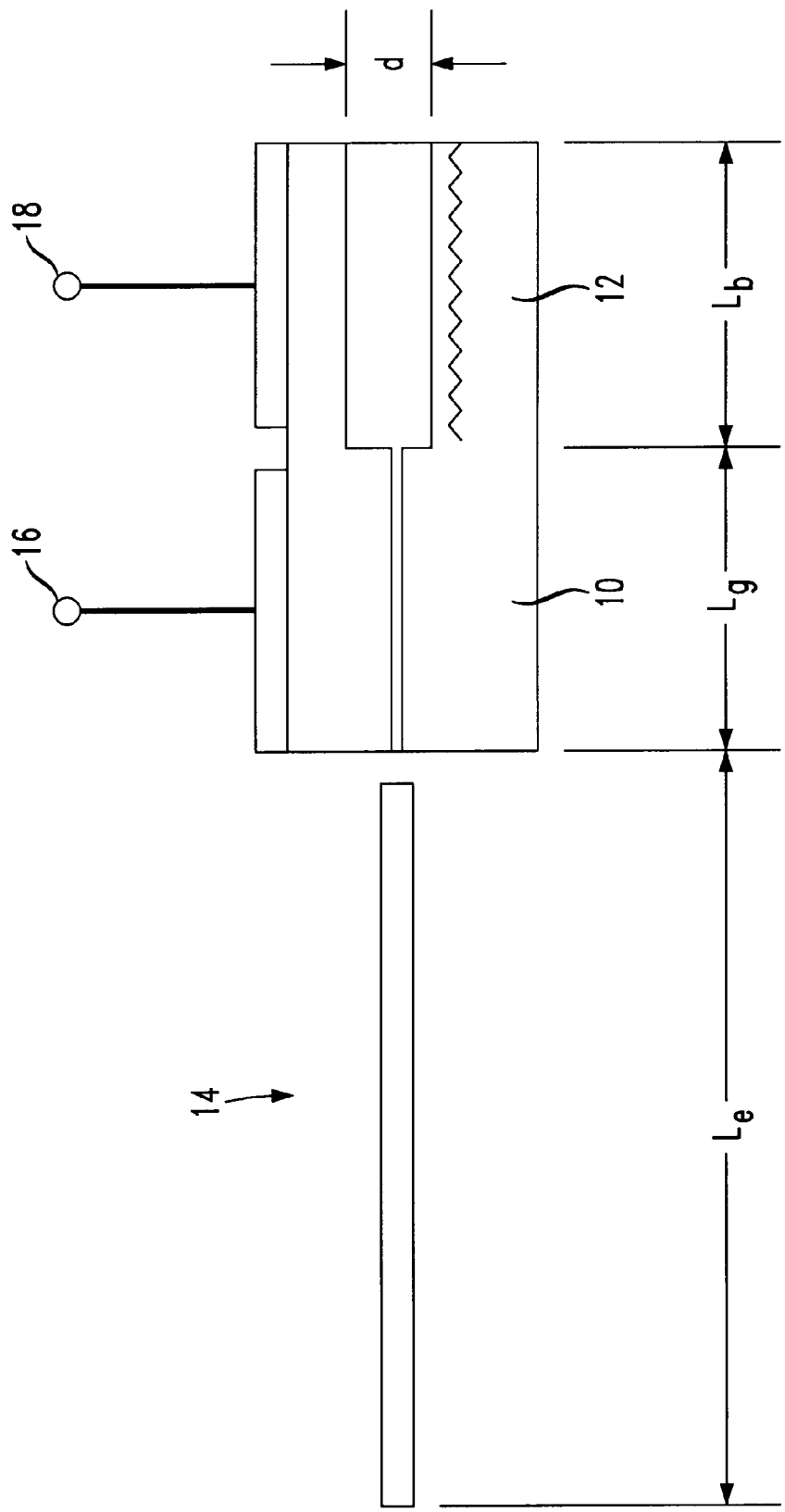
FIG. 1 is a schematic, cross-sectional, side view, illustration of a hybrid tunable Bragg laser device in accordance with an embodiment of the present invention.

A hybrid tunable Bragg laser device in accordance with an embodiment of the present invention is shown schematically in FIG. 1. The device includes a gain section 10 and a Bragg reflector section 12, having lengths $L_g$ and $L_b$, respectively. The band gaps of the active regions of gain section 10 and Bragg reflector section 12 are hereinafter denoted $E_{gg}$ and $E_{gb}$ respectively. These band gaps are preferably selected such that $E_{gb}$ is greater than $E_{gg}$, wherein the difference $E_{gb}-E_{gg}$ provides a predetermined, minimum, transparency when Bragg reflector section 12 is unbiased and a maximum change in refractive index when Bragg reflector section 12 is biased. The Bragg period, $\Lambda$, of the laser device is preferably selected to provide lasing in a desired wavelength range, while the coupling coefficient, $\kappa$, of the laser device is preferably selected to provide a Bragg reflection spectral width corresponding to a narrow optical spectrum, for example, the optical spectrum depicted in FIG. 3 which is discussed below. Exemplary values for the coupling coefficient and Bragg period, in an embodiment of the present invention, may be $\kappa = 33$ cm$^1$ and $\Lambda \approx 0.2308$ microns.

The lengths of gain section 10 and Bragg reflector section 12, $L_b$ and $L_g$, are preferably selected such that $L_g \geq L_b$ to provide sufficient optical loss at wavelengths corresponding to active region $E_{gb}$ when the Bragg reflector section is forward biased and exhibits high gain. In this configuration, wavelength tuning in accordance with the invention may be performed by biasing Bragg reflector section 12 and thereby modifying its refractive index. Biasing voltage to gain section 10 and Bragg reflector section 12 may be provided through biasing terminals 16 and 18, respectively, as is known in the art.

In accordance with the present invention, the tunable laser further includes an optical extension 14 of length $L_e$. The function of optical extension 14 is to extend the optical path length of the laser device and, thus, to provide a high density of longitudinal modes allowing substantially continuous lasing action when Bragg reflector section 12 is used to tune the lasing wavelength. This allows smooth and substantially continuous tuning of the lasing wavelength without mode hopping. In a preferred embodiment of the invention, the length of optical extension 14 is greater than 0.1 cm, preferably greater than 1 cm, for example, the extension may be 5–10 cm long. At this length, the optical properties, e.g., the reflectivity, of optical extension 14 provide a sufficient number of longitudinal modes to enable substantially continuous wavelength tuning as described in detail below.

It should be noted that optical extension 14 is an electrically passive, non-tunable, element which enables substantially continuous wavelength tuning in accordance with the present invention. The actual tuning is performed by changing the bias voltage across Bragg reflector section 12. This is in contrast to prior art three-sectioned tunable Bragg lasers which include an electrically biased phase section in addition to gain and Bragg reflector sections.

Analytical formulations of the tunable laser of FIG. 1 will now be described. The wavelength of peak reflection in Bragg reflector section 12 may be varied either by reverse biasing of active range $E_{gb}$, and using the Franz-Keldysh effect to increase the refractive index, or by forward biasing of active range $E_{gb}$ and using optical gain to decrease the refractive index. The forward biasing method for decreasing the peak reflection wavelength is described in detail below. The reverse biasing method for increasing the peak reflection wavelength is not described herein, however, the analytical formulation for this method should be apparent to a person of ordinary skill in the art.

In a double heterostructure arrangement, such as the arrangement shown in FIG. 1, forward biased optical gain may result from inversion. A complete analytical description of gain, based on fundamental principles, is generally complex and involves selection rules for transitions. Such a description is provided in G. P. Agrawal and N. K. Dutta "Semiconductor Lasers", Van Nostrand Reinhold, New York 1993. A phenomenological approach to describe gain, tailored to specific experimental observations, is given below for simplicity and convenience of explanation. For the purpose of the following analysis, an optical loss $\alpha$ may be expressed in the form:

$$\alpha(E,V) = \frac{\alpha_0\left(1 - a_1 e^{\frac{q(V-E)}{kT}}\right)}{1 + e^{\frac{(Eg-E)}{\delta E}}} \quad (1)$$

wherein E (Volts) is the photon energy, V (Volts) is the separation of quasi Fermi levels in the active region, q is the electric charge, T is the temperature in degrees Kelvin, $E_g$ (Volts) is the material bandgap, $a_1$ is a constant $\delta E$ is a constant which determines the slope of the band edge absorption curve, and $\alpha_0$ the absorption coefficient.

To determine the preferred value of the constants for a given material, equation 1 can be applied to published experimental data. For example, applying Equation 1 to published data on GaAlAs, e.g., as described in R. F. Kazarinov, C. H. Henry and R. A. Logan, "Longitudinal Mode Self-Stabilization in Semiconductor Lasers" J. Appl. Phys. vol 53, p. 4631, 1982, shows that a good fit is obtained when $E_g$=1.435 V, $\delta E$=6.5×10$^{-3}$$E_g$, $\alpha_0$=10$^4$cm$^{-1}$ and $a_1$=0.8. Constants for other materials may be similarly determined by appropriate choice of energy data to be substituted in Equation 1. Once the gain or loss under a given bias is determined, a corresponding change in the real part of the refractive index may be derived from the Kramers-Kronig relation, as described in C. H. Henry, "Spectral Properties of Semiconductor Lasers" Chapter 3, Semiconductors and Semimetals, vol. 22, Part B, editor W. T. Tsang, Academic Press.

In a preferred embodiment of the invention, the design of Bragg reflector section 12 makes maximum advantage of the change in refractive index in the Bragg section. For example, to operate in the 1.55 micron range, the bandgap of the Bragg active region may be 0.855 V, and the confining layers may be InP with a bandgap of 1.4 V. This gives a large difference in the refractive index, which is required in order to increase the confinement factor. In addition, the active region may be selected to be as thick as possible without exciting a high order transverse mode, for example, the active region may have a thickness of about 0.8 microns. A confinement factor, Γ, for the TE mode of the laser device can then be derived from standard equations, and may be in the range of 0.8 to 0.9, as described in B. W. Hakki and T. L. Paoli, "Gain Spectra in GaAs Double Heterostructure Injection Lasers", J. Appl. Phys. vol. 46, pp 1299–1306, 1975 ("Hakki and Paoli"). The thickness that maybe selected for the active region can be determined from Eq. (A3) of Hakki and Paoli.

The gain in gain section 10, denoted $G_g(E)$, is thus given by:

$$G_g(E) = L_g \alpha_g(E, V_g) \quad (2)$$

wherein $\alpha$ may be derived from Equation 1 with appropriate substitutions for the bandgap energy and junction voltage. A similar expression applies to Bragg reflector section 12. Because the refractive index is altered by gain in the Bragg reflector section, it is useful to keep the length of gain section 10, $L_g$, equal to or greater than the length of Bragg reflector section 12, $L_b$, such that the net total gain at high photon energies does not exceed a predetermined threshold that may result in excitation of spurious lasing. With this choice of parameters, the absorption of gain section 10 at high energies, where Bragg reflector section 12 exhibits maximum gain, provides sufficient loss to inhibit unwanted oscillations.

In an embodiment of the invention, an optical cavity is formed by Bragg reflector section 12, gain section 10 and extension 14 in tandem. The field reflection, $F_b$, of Bragg reflector section 12 can be derived from standard formulae based on the magnitude for the reflection coefficient and phase shift, as described in H. Kawanishi, Y. Suematsu, K. Utaka, Y. Itaya, and S. Arai, "Ga$_x$In$_{1-x}$As$_y$/InP Injection Laser Partially Loaded with First Order Bragg Reflector", IEEE J. Quantum Electron. QE-15, pp. 701–706, 1979. Thus, the field reflection can be represented as follows:

$$F_b(E) = \sqrt{R_b(E)} \, e^{j\theta_b(E)} \quad (3)$$

wherein $R_b(E)$ is a power reflection coefficient and $\theta_b(E)$ is the phase shift.

In a preferred embodiment of the invention, extension 14 provides a nearly non-dispersive effective reflection $R_e$ given by:

$$R_e = c^2 R_m \quad (4)$$

wherein c is the coupling coefficient of the active region to extension 14 and $R_m$ is the reflection coefficient of the uncoupled end of extension 14.

The lasing conditions for threshold and phase may then be calculated as follows:

$$-\ln[R_e R_b(E)] = 2G_g(E)\Gamma_g \qquad (5)$$

and $$2[L_e k_e(E_m) + L_g k_g(E_m)] + \theta_b(E_m) = 2m\pi \qquad (6)$$

wherein $E_m$ is the lasing energy of the $m_{th}$ longitudinal mode and k(E) is the propagation constant in the medium of extension 14.

To provide a high density of longitudinal modes, it is necessary that $L_e$ be much greater than $L_b$ and $L_g$. The longitudinal mode spacing $\Delta\lambda$ is given by:

$$\Delta\lambda = \frac{\lambda^2}{2n_e L_e} \qquad (7)$$

wherein $n_e$ is the refractive index of extension 14. Furthermore, to avoid chromatic signal dispersion in high speed transmission systems, the longitudinal modal spacing must be sufficiently small to yield a narrow spectral width. Thus, for example, if extension 14 includes a polarization maintaining fiber (PMF) with refractive index of 1.5 and the longitudinal modal spacing is 0.01 nm, the length of the extension would be 8 cm. With these parameters, the emission spectral width is narrow enough to avoid dispersion even if two or more modes are excited, as depicted in FIG. 3 which is discussed in detail below.

An example of the operation of a hybrid tunable Bragg laser in accordance with an embodiment of the present invention will now be described. In this example, the band-gaps of gain section 10 and Bragg reflector section 12 are 0.81 and 0.855 V, respectively, and $\delta = 0.008 E_g$. In this example, it is assumed that the confining layers for Bragg reflector section 12 are InP and that the thickness of the active region of Bragg reflector section 12 is 0.8 microns. It is further assumed that the Bragg coupling constant, κ, is 33.3 cm$^{-1}$, and that the Bragg period, Λ, is 0.2308 microns. The lengths of the gain and Bragg reflector sections, $L_g$ and $L_b$, are assumed to be 0.03 cm each.

Figure 2:
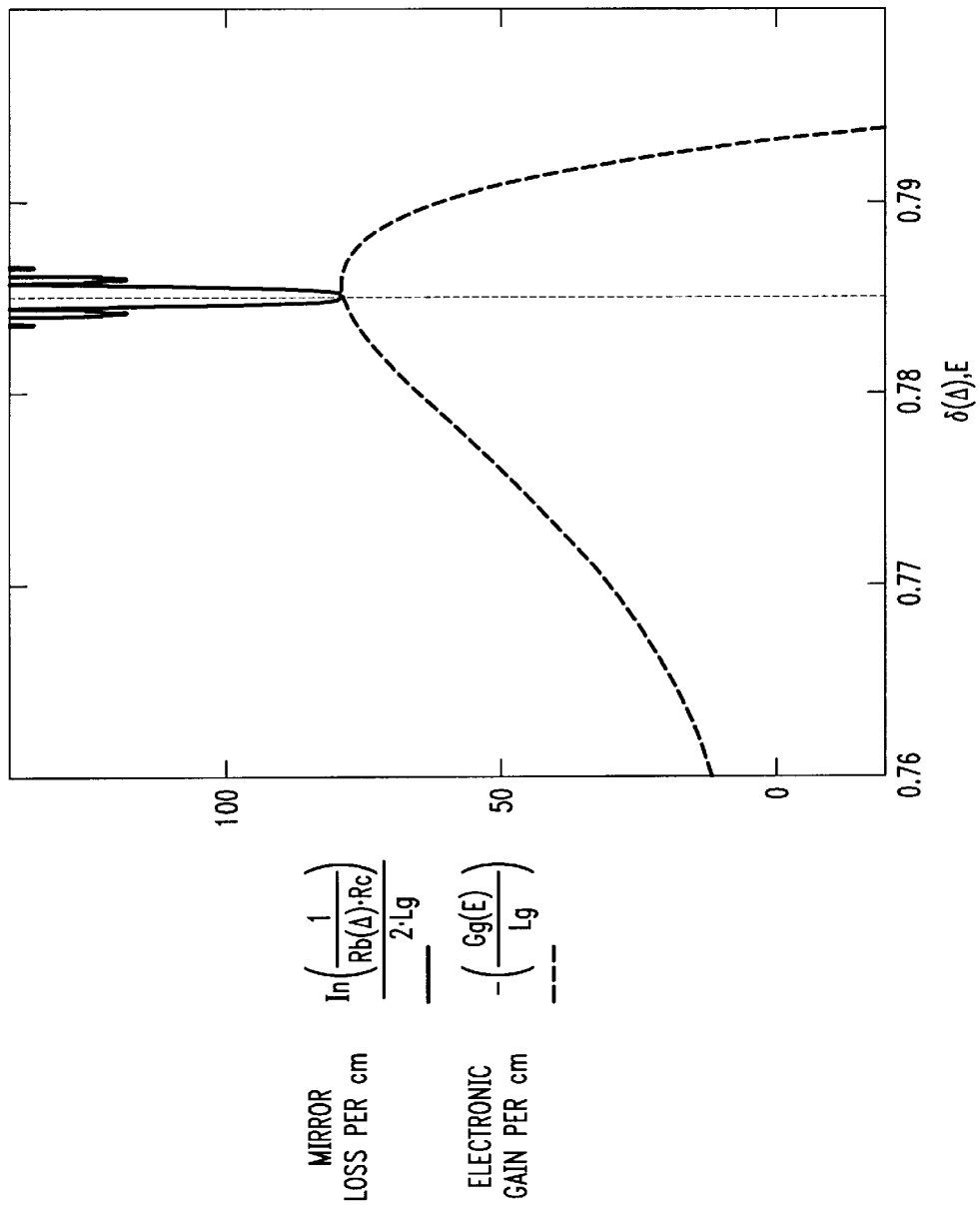
FIG. 2 is a schematic illustration of graphs representing the total optical loss and the electronic gain of a laser device in accordance with an embodiment of the present invention as a function of photon energy.

The solid curve in FIG. 2 schematically illustrates the total optical loss as a function of photon energy, in accordance with Equation 5 above, for an effective reflectivity of 0.01 of optical extension 14. The dashed curve in FIG. 2 schematically illustrates the electronic gain of the laser device when the voltages across gain section 10 and Bragg reflector section 12 are 0.799 V and 0.885 V, respectively. The lasing threshold condition for gain is satisfied at the energy level for which the round-trip gain is unity. In the example of FIG. 2 this occurs at a level of 0.7848 V in the example of FIG. 2.

Figure 3:
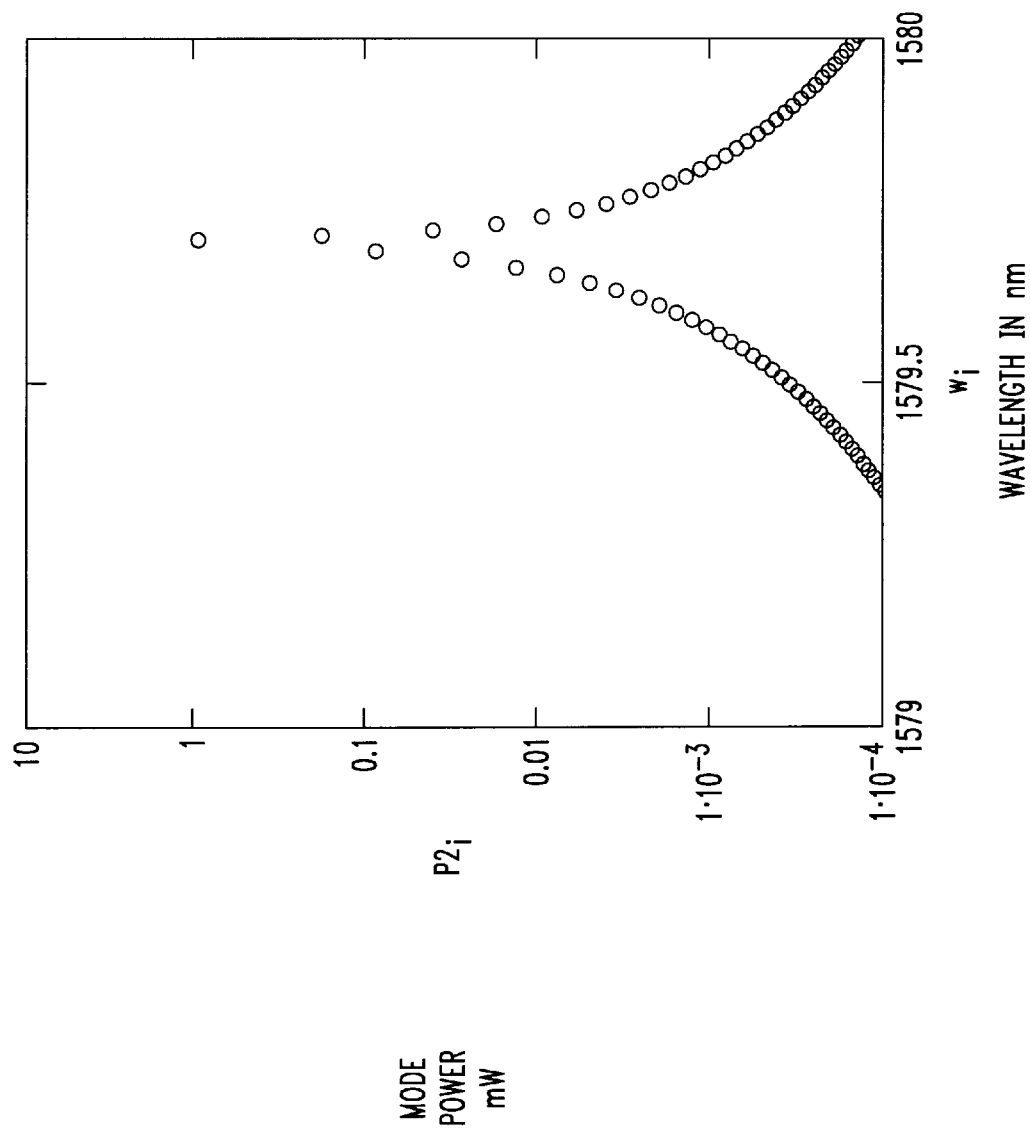
FIG. 3 is a schematic illustration of a graph representing mode power as a function of wavelength, for a laser device using phase matching in accordance with an embodiment of the present invention.

FIG. 3 schematically illustrates the lasing condition for phase matching, in accordance with Equation 6, when a PMF fiber having a length of 8 cm is used for optical extension 14. Each circle in FIG. 3 represents a wavelength of a longitudinal mode which satisfies Equation 6, i.e. the round trip phase is an integer multiple of 2π. The lasing spectrum given in FIG. 3 is obtained for bias conditions which yield an output power of 1 mW in the main mode. In the conditions of FIG. 3, several longitudinal modes which are spaced 0.01 nm apart are lasing simultaneously, providing a RMS spectral width of 0.03 nm. This allows for a substantially continuous variation of the wavelength of the laser device, as Bragg reflector section 12 is tuned, and provides a sufficiently narrow optical spectrum to avoid signal dispersion. The spectral width can be increased by increasing the width of the Bragg reflection curve. Thus, for $L_b = 0.01$ cm and $\kappa = 100$ cm$^{-1}$ the RMS width under the conditions of FIG. 3 increases to 0.06 nm. This demonstrates that the spectral width can be controlled by controlling the physical parameters for Bragg reflector section 12.

In an embodiment of the present invention, the range of wavelength tuning is determined by the maximum allowed bias on Bragg reflector section 12. In the example of FIG. 3, forward bias of Bragg reflector section 12 tunes the wavelength over the range of 1592–1570 nm, wherein the 1570 nm short wavelength limit corresponds to the maximum forward bias that may be applied to Bragg reflector section 12 without causing spurious oscillations due to excessive gain. Similarly, by applying a reverse bias of approximately 16 V (corresponding to a an electric field strength $2\times10^5$ V/cm) across Bragg reflector section 12 would cause a shift of the long wavelength to 1596 nm due to the Franz-Keldysh effect, according to the formulae outlined in T. H. Wood, "Mutiple Quantum Well (MQW) Waveguide Modulators" J. Lightwave Technol. vol. LT-6, pp. 743–757, 1988. Therefore, the total tuning range of this exemplary device is approximately 26 nm.

To avoid undue spurious oscillations, optical reflections at the interfaces between the different sections of the laser device should be reduced to a minimum. For example, optical reflections between gain section 10 and optical extension 14, as well as the back facet of the Bragg reflector section, can be minimized by using antireflection coatings.

What is claimed is:

1. A hybrid tunable Bragg laser comprising:

a double heterostructure gain section;

a Bragg reflector section optically coupled to said gain section; and an optical extension constructed to yield a plurality of longitudinal modes.

2. A hybrid tunable Bragg laser according to claim 1 wherein the optical extension has a length and effective reflectivity adapted to yield said plurality of longitudinal modes.

3. A hybrid tunable Bragg laser according to claim 2 wherein the length of the optical extension is greater than 0.1 centimeters.

4. A hybrid tunable laser according to claim 3 wherein the length of the optical extension is between 5 and 10 centimeters.

5. A hybrid tunable Bragg laser according to claim 2 wherein the effective reflectivity of the optical extension is such that reflections between the Bragg reflector section and the optical extensions are significantly greater than other reflections within the hybrid tunable laser.

6. A hybrid tunable Bragg laser according to claim 1 having an emission spectrum width of not more than 1 nanometer.

7. A hybrid tunable Bragg laser according to claim 6 wherein the Bragg reflector section has a length of between 100 and 500 microns and a coupling coefficient, κ, of between 10 and 100 cm$^{-1}$.

8. A hybrid tunable Bragg laser according to claim 1 wherein the band gap of the Bragg reflector section is larger than the band gap of the gain region, wherein the thickness of the Bragg reflector section is larger than the thickness of the gain region and wherein the laser has a Bragg period which provides stimulated emission in a desired range of operation.

9. A hybrid tunable Bragg laser according to claim 1 wherein the wavelength generated by the laser is tuned to a desired value by controlling a biasing current applied to the Bragg reflector section.

10. A hybrid tunable Bragg laser according to claim 9 wherein the wavelength generated by the laser is decreased by applying a forward bias to the Bragg reflector section.

11. A hybrid tunable Bragg laser according to claim 9 wherein the wavelength generated by the laser is increased by applying a reverse bias to the Bragg reflector section.

12. A hybrid tunable Bragg laser according to claim 11 wherein the gain section is biased with a current level which provides substantially unity round trip gain.

13. A hybrid tunable Bragg laser according to claim 1 further comprising means for reducing undesired reflections to enhance the dominance of reflection between the Bragg reflector section and the optical extension.

14. A hybrid tunable Bragg laser according to claim 13 wherein said means for reducing undesired reflections comprises means for minimizing undesired internal reflections of the laser.

* * * * *